US006585534B2

(12) United States Patent
Llapitan et al.

(10) Patent No.: US 6,585,534 B2
(45) Date of Patent: *Jul. 1, 2003

(54) RETENTION MECHANISM FOR AN ELECTRICAL ASSEMBLY

(75) Inventors: David J. Llapitan, Puyallup, WA (US); Michael Crocker, Tacoma, WA (US); Peter Davison, Sumner, WA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,520

(22) Filed: Aug. 20, 1998

(65) Prior Publication Data
US 2001/0019913 A1 Sep. 6, 2001

(51) Int. Cl.⁷ .................................................. H01R 13/62
(52) U.S. Cl. ........................................ 439/327; 361/703
(58) Field of Search .................................. 439/327, 328, 439/325, 487, 573; 361/703, 704, 709–721, 752, 756, 741, 801, 802; 211/41.17

(56) References Cited

U.S. PATENT DOCUMENTS

| 3,631,299 A | 12/1971 | Meyer et al. |
| 3,662,224 A | 5/1972 | Rauch |
| 3,932,016 A | 1/1976 | Ammenheuser |
| 4,226,491 A | 10/1980 | Kazana et al. |
| 4,349,237 A | 9/1982 | Cobaugh et al. |
| 4,521,827 A | 6/1985 | Jordan et al. |
| 4,573,104 A | 2/1986 | Kamada |
| 4,602,315 A | 7/1986 | Breese |
| 4,652,971 A | 3/1987 | Peterson et al. |
| 4,717,989 A | 1/1988 | Be Barros et al. |
| 4,785,379 A | 11/1988 | Goodrich |
| 4,899,256 A | 2/1990 | Sway-Tin |
| 4,910,434 A | 3/1990 | Doumani et al. |
| 4,917,618 A | 4/1990 | Behrens et al. |
| 5,006,667 A | 4/1991 | Lonka |
| 5,014,160 A | 5/1991 | McCoy et al. |
| 5,109,318 A | * 4/1992 | Funari et al. ............... 361/388 |
| 5,155,663 A | 10/1992 | Harase |
| 5,168,926 A | 12/1992 | Watson et al. |
| 5,241,453 A | 8/1993 | Bright et al. |
| 5,280,409 A | 1/1994 | Selna et al. |
| 5,286,217 A | 2/1994 | Liu et al. |
| 5,289,347 A | 2/1994 | McCarthy et al. |
| 5,294,994 A | 3/1994 | Robinson et al. |
| 5,309,315 A | 5/1994 | Naedel et al. |
| 5,323,299 A | 6/1994 | Weber |
| 5,333,100 A | 7/1994 | Anhalt et al. |
| 5,396,403 A | 3/1995 | Patel |
| 5,398,822 A | 3/1995 | McCarthy et al. |
| 5,477,421 A | 12/1995 | Bethurum |
| 5,526,229 A | 6/1996 | Wakabayashi et al. |

(List continued on next page.)

Primary Examiner—Renee Luebke
Assistant Examiner—Ann McCamey
(74) Attorney, Agent, or Firm—Blakely, Sokoloff, Taylor & Zafman LLP

(57) ABSTRACT

A retention mechanism for an electronic assembly which has a substrate and a heat sink. The retention mechanism includes a substrate slot that receives the substrate and a heat sink slot that receives the heat sink. There may be two retention mechanisms that are attached to a printed circuit board adjacent to an electrical connector. There may be two heat sink slots symmetrically located about the substrate slot so that the mechanism can be mounted to a left side or a right side of the connector. The symmetric slots eliminate the need for a left side mechanism and a right side mechanism. The retainer mechanism may also have a nut retainer that captures a nut that is used to attach the mechanism to the printed circuit board. The nut retainer allows the nut to be transported with the retainer mechanism during an assembly process.

32 Claims, 4 Drawing Sheets

U.S. PATENT DOCUMENTS

| | | |
|---|---|---|
| 5,550,713 A | 8/1996 | Pressler et al. |
| 5,586,005 A | 12/1996 | Cipolla et al. |
| 5,642,263 A | 6/1997 | Lauruhn |
| 5,650,917 A | 7/1997 | Hsu |
| 5,659,459 A | 8/1997 | Wakabayashi et al. |
| 5,676,555 A | 10/1997 | Yu et al. |
| 5,679,009 A * | 10/1997 | Okumura et al. ............ 439/573 |
| 5,689,405 A | 11/1997 | Bethurum |
| 5,726,865 A | 3/1998 | Webb et al. |
| 5,730,210 A | 3/1998 | Kou |
| 5,748,446 A | 5/1998 | Freightner et al. |
| 5,784,263 A | 7/1998 | Nelson |
| 5,822,197 A | 10/1998 | Thuault |
| 5,829,601 A | 11/1998 | Yurchenco et al. |
| 5,831,828 A | 11/1998 | Cutting et al. |
| 5,831,830 A | 11/1998 | Mahler |
| 5,838,542 A | 11/1998 | Nelson et al. |
| 5,847,928 A | 12/1998 | Hinshaw et al. |
| 5,854,738 A | 12/1998 | Bowler |
| 5,856,910 A | 1/1999 | Yurchenco et al. |
| 5,870,288 A | 2/1999 | Chen |
| 5,883,782 A | 3/1999 | Thurston et al. |
| 5,883,783 A | 3/1999 | Turturro |
| 5,889,649 A | 3/1999 | Nabetani et al. |
| 5,889,656 A | 3/1999 | Yin |
| 5,892,659 A | 4/1999 | Cooper et al. |
| 5,894,408 A | 4/1999 | Stark et al. |
| 5,901,039 A | 5/1999 | Dehaine et al. |
| 5,902,143 A * | 5/1999 | Pan et al. .................... 439/327 |
| 5,943,210 A | 8/1999 | Lee et al. |
| 5,947,191 A | 9/1999 | Hiteshew et al. |
| 5,965,937 A | 10/1999 | Chiu et al. |
| 5,973,399 A | 10/1999 | Stark et al. |
| 5,978,873 A | 11/1999 | Phan |
| 5,990,549 A | 11/1999 | Chiu et al. |
| 5,993,252 A * | 11/1999 | Laurx ......................... 439/573 |
| 6,025,990 A | 2/2000 | Daskalakis et al. |
| 6,028,771 A | 2/2000 | Wong et al. |
| 6,030,251 A | 2/2000 | Stark et al. |
| 6,031,725 A * | 2/2000 | Scholder et al. ............ 361/759 |
| 6,038,131 A * | 3/2000 | Valosen et al. ............. 361/756 |
| 6,043,984 A * | 3/2000 | Tseng ......................... 361/704 |
| 6,046,906 A * | 4/2000 | Tseng ......................... 361/704 |
| 6,101,096 A | 8/2000 | MacGregor et al. |
| 6,159,031 A | 12/2000 | Llapitan et al. |
| 6,208,514 B1 | 3/2001 | Stark et al. |
| 6,264,478 B1 | 7/2001 | Davison et al. |

\* cited by examiner

RETENTION MECHANISM FOR AN ELECTRICAL ASSEMBLY

BACKGROUND OF THE INVENTION

1. Field of the Invention

The present invention relates to a retention mechanism for securing an electronic assembly to a motherboard that has studs provided.

2. Background Information

FIG. 1 shows a product marketed by Intel Corporation, the assignee of this application, which is referred to as a single edge contact cartridge (SECC). The Intel SECC includes a microprocessor which is assembled into a package 1 that is mounted to a substrate 2. The SECC may also have other integrated circuit packages 3 which contain static random access memory (SRAM) integrated circuits.

One edge of the substrate 2 has a plurality of conductive pads 4 which can be inserted into an electrical connector 5. The electrical connector 5 can be mounted to a printed circuit board 6 such as the motherboard of a computer. The pads 4 and connector 5 electrically couple the substrate 2 to the circuit board 6.

The substrate 2 and integrated circuit packages 1 and 3 are enclosed by a cover 7 and a thermal plate 8. The cover 7, plate 8 and substrate 2 provide an electronic cartridge which can be plugged into a computer motherboard 6.

The electrical system shown in FIG. 1 can sustain external shock and vibration loads. Such loads may produce intermittent separation between the pads 4 and the connector 5. Intermittent separation between the pads 4 and connector 5 may create electrical "opens." The system is provided with a retention mechanism 9 to secure the substrate 2 to the connector 5 and prevent contact separation under shock and vibration loads.

The retention mechanism 9 includes a pair of posts 10 that are mounted to the circuit board 6. Each post 10 includes an aperture 11 which receives a latch 12 that extends from the cover 7 of the cartridge. When inserted into the aperture 11 each latch 12 prevents the substrate 2 from being pulled out of the connector 5. The substrate 2 can be unplugged from the connector 5 by pressing a pair of latch levers 13 and pulling the cartridge away from the board 6. Pressing the levers 13 moves the latches 12 out of the apertures 11 of the posts 10.

The integrated circuits generate heat which must be removed from the circuits. The thermal plate 8 is thermally coupled to the integrated circuit package 1 of the SECC to provide a thermal path for the heat generated by the microprocessor. A heat sink 14 may be mounted to the thermal plate 8 to further facilitate the removal of the heat.

The heat sink 14 is typically constructed from a thermally conductive material such as aluminum or copper. Metal heat sinks 14 have a weight which increases the magnitude of loads on the cartridge, particularly when the system is subjected to shock or vibration.

The Intel SECC includes a heat sink support assembly 15 that is mounted to the printed circuit board 6 and supports the heat sink 14. The support assembly 15 includes a support bar 16 that is inserted into holes of the circuit board 6. The assembly 15 also includes a tie bar 17 that is inserted into a groove 18 of the heat sink 14 and snapped onto posts 19 of the support bar 16.

It is desirable to reduce the number of parts in an electrical assembly to reduce the complexity and cost of mass producing the product. It would therefore be desirable to provide a single retention mechanism which secures the substrate to the connector and supports a heat sink of the electronic assembly. Additionally, it would be desirable to eliminate the through holes required to install the support bar of the SECC. The through holes occupy valuable routing space on the printed circuit board.

SUMMARY OF THE INVENTION

One embodiment of the present invention is a retention mechanism for an electronic assembly which has a substrate and a heat sink. The assembly includes a heat sink slot that receives the heat sink, and a substrate slot that receives the substrate.

DETAILED DESCRIPTION OF THE INVENTION

One embodiment of the present invention is a retention mechanism for an electronic assembly which has a substrate and a heat sink. The retention mechanism includes a first slot that receives the heat sink and a second slot that receives the substrate. The heat sink guides the substrate into the connector. There may be two retention mechanisms that are attached to a printed circuit board adjacent to an electrical connector.

There may be two heat sink slots symmetrically located about the substrate slot so that the mechanism can be mounted to a left side or a right side of the connector. The symmetric slots eliminate the need for a left side mechanism and a right side mechanism. Providing a single mechanism reduces the complexity and cost of mass producing an electrical assembly which contains the substrate, heat sink and mechanism. Supporting both the substrate and the heat sink with a single mechanism also eliminates the need to provide a separate support assembly for the heat sink.

The retainer mechanism may also have a nut retainer that captures a nut that is used to attach the mechanism to the printed circuit board with studs. The nut retainer allows the nut to be transported with the retainer mechanism during an assembly process.

Figure 1:
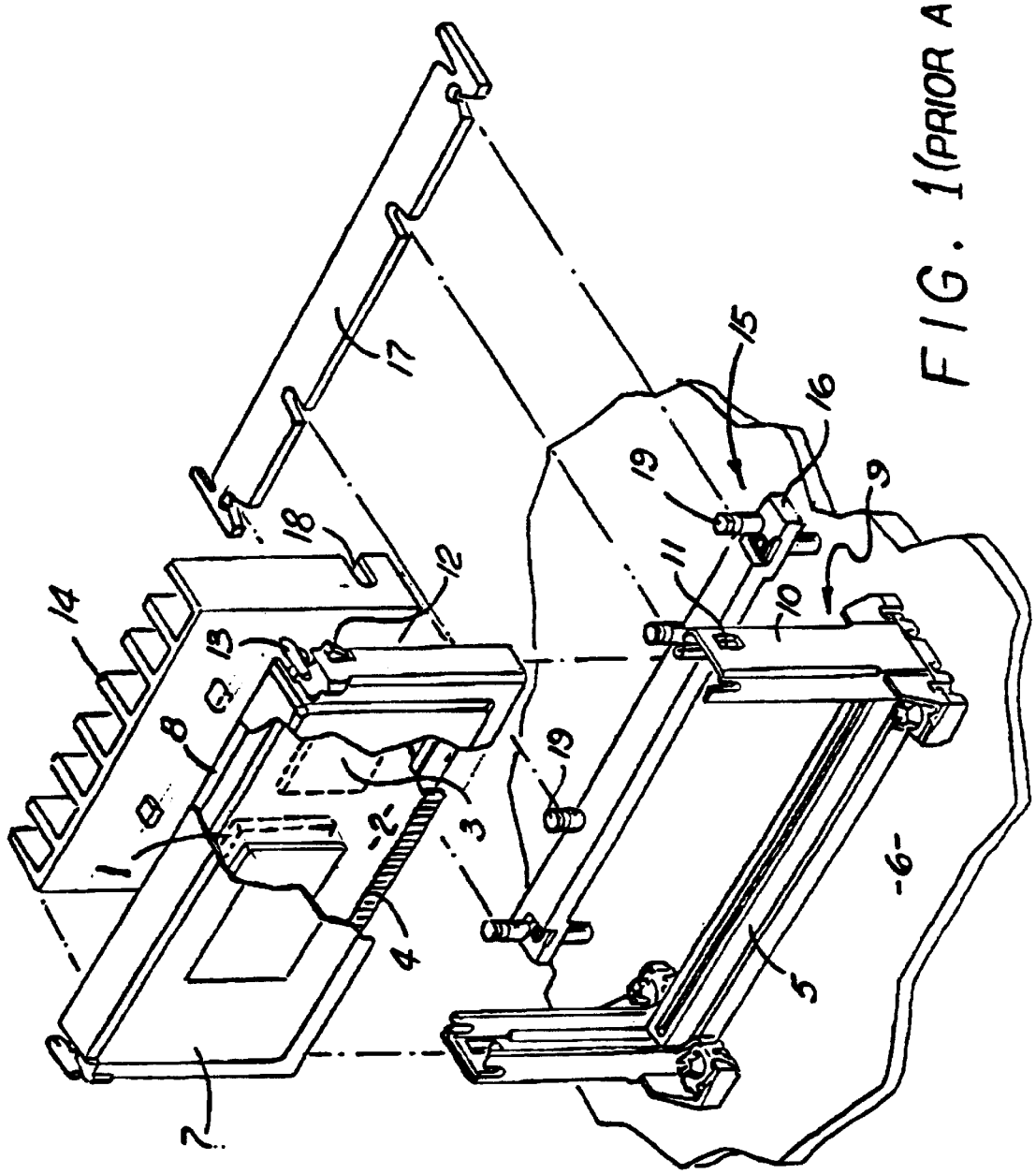
FIG. 1 is a perspective view of an electrical assembly of the prior art.
Figure 2:
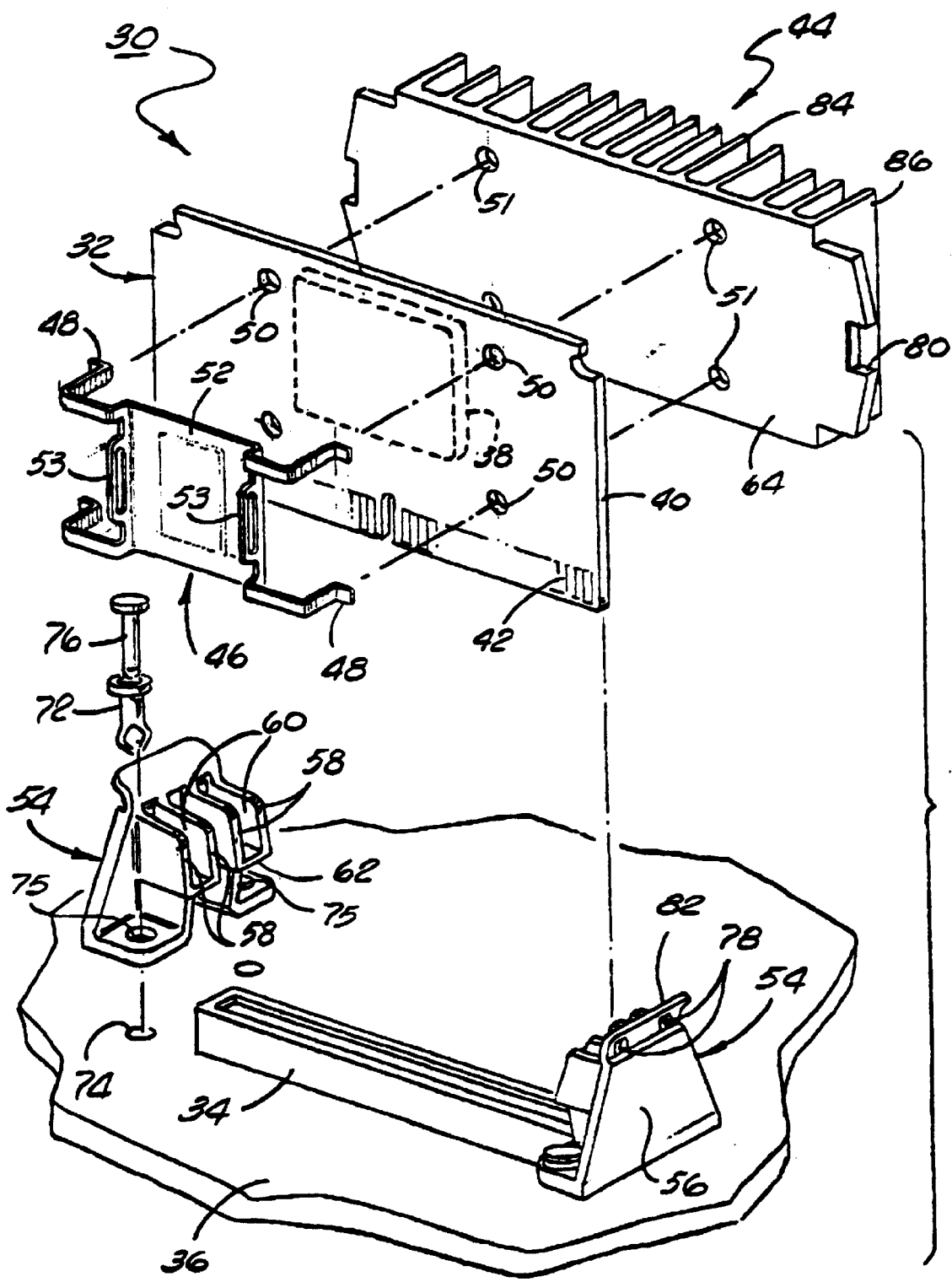
FIG. 2 is a perspective view of an embodiment of an electrical assembly of the present invention.

Referring to the drawings more particularly by reference numbers, FIG. 2 shows an embodiment of an electrical assembly 30 of the present invention. The assembly 30 includes an electronic assembly 32 that can be plugged into an electrical connector 34. The connector 34 may be mounted to a printed circuit board 36. The printed circuit board 36 may be a motherboard of a computer.

The electronic assembly 32 may include an integrated circuit package 38 that is mounted to a substrate 40. The integrated circuit package 38 may contain an integrated circuit (not shown) such as a microprocessor. The substrate 40 may be a printed circuit board. One edge of the substrate 40 may have a plurality of contacts 42 that can be inserted into the electrical connector 34. The substrate 40 may have routing traces, power/ground planes, vias, surface pads, etc. which electrically connect the integrated circuit package 38 to the contacts 42.

The electronic assembly 32 may further have a heat sink 44 that is mounted to the substrate 40. The heat sink 44 may be pressed against the integrated circuit package 38 to provide a thermal path for the heat generated by the integrated circuit. The assembly 32 may include a clip 46 which attaches the heat sink 44 to the substrate 40.

The clip 46 may have a plurality of L-shaped ears 48 that are inserted through clearance holes 50 in the substrate 40 and corresponding attachment holes 51 in the heat sink 44. The clip 46 may have four ears 48 which extend from a center plate portion 52. The L-shaped ears 48 are bent during insertion through the holes 50 and 52. There may be provided a tool (not shown) which bends the ears 48 during the insertion step. The clip 46 may be constructed from a steel material which does not yield during the assembly process. The center plate portion 52 may have a pair of handles 53 that allow an operator to more easily grasp the clip 46 during installation.

Figure 3:
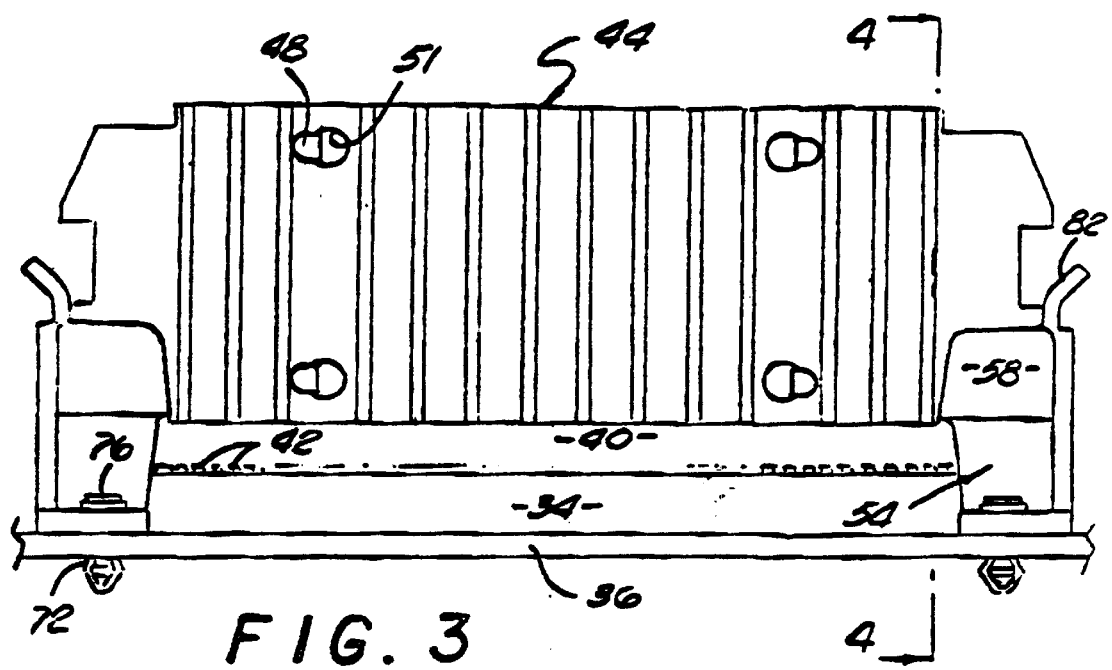
FIG. 3 is a rear view showing a clip that attaches a heat sink to a substrate.

As shown in FIG. 3, the L-shaped ears 48 snap back after clearing the attachment holes 51 of the heat sink 44. When assembled, the clip 46 may exert a spring force that pushes the heat sink 44 into the integrated circuit package 38.

Referring to FIG. 2, the assembly 30 may include a pair of retention mechanisms 54 that are mounted to the printed circuit board 36. The retention mechanisms 54 retain and support the electronic assembly 32. Each retention mechanism 54 may have a back wall 56 that extends from the printed circuit board 36. The mechanism 54 may include a plurality of first walls 58 which extend from the backwall 56 and are separated from each other by a pair of heat sink slots 60. The walls 58 are adjoined by a base portion 62. A pedestal 64 portion of the heat sink 44 may be inserted into either heat sink slot 60. Insertion of the heat sink 44 into the heat sink slot 60 guides the substrate 40 into the connector 34.

Figure 4:
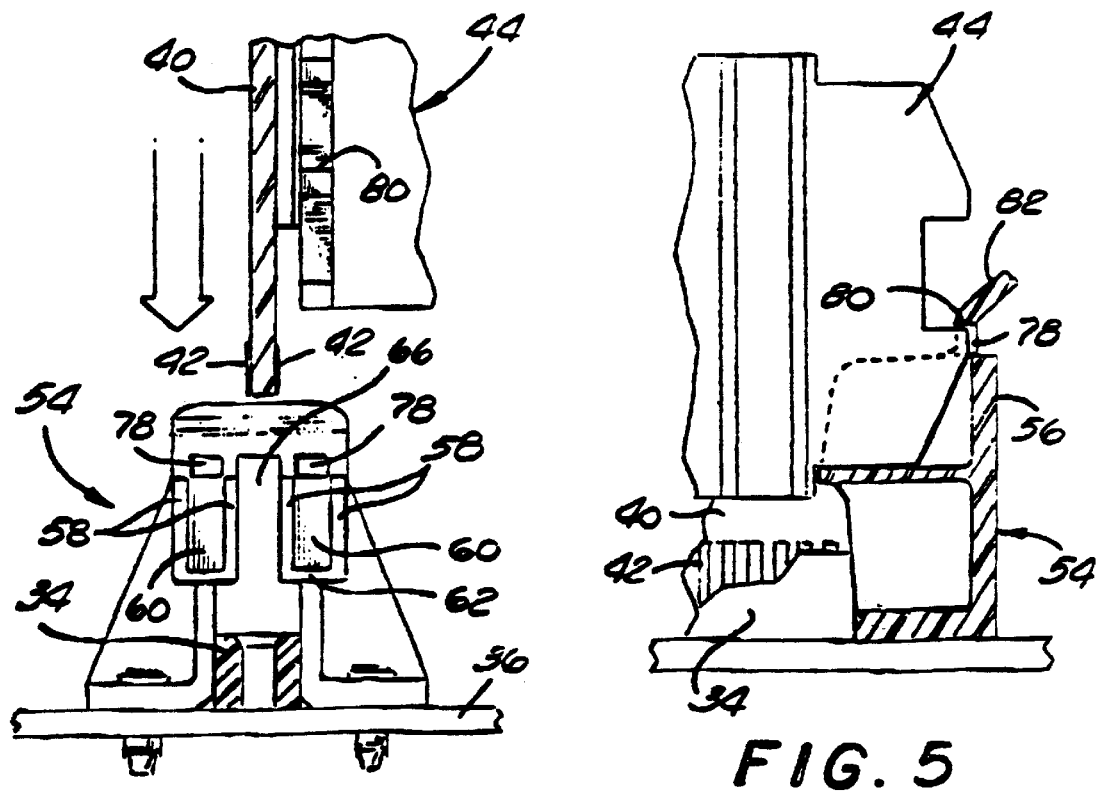
FIG. 4 is an end view showing a substrate being inserted into a retention mechanism.

As shown in FIG. 4, walls 58 may be separated from each other by a substrate slot 66. The substrate slot 66 may receive the substrate 40.

Referring to FIG. 2, each retention mechanism 54 may have a pair of studs 72 that are pressed into a pair of corresponding holes 74 in the printed circuit board 36 through clearance holes 75 in the mechanism 54. Pins 76 may be pressed into the retention studs 72 to expand the studs 72 and secure the retention mechanism 54 to the circuit board 36. The retention mechanism 54 may have a pair of latch apertures 78.

Figure 5:
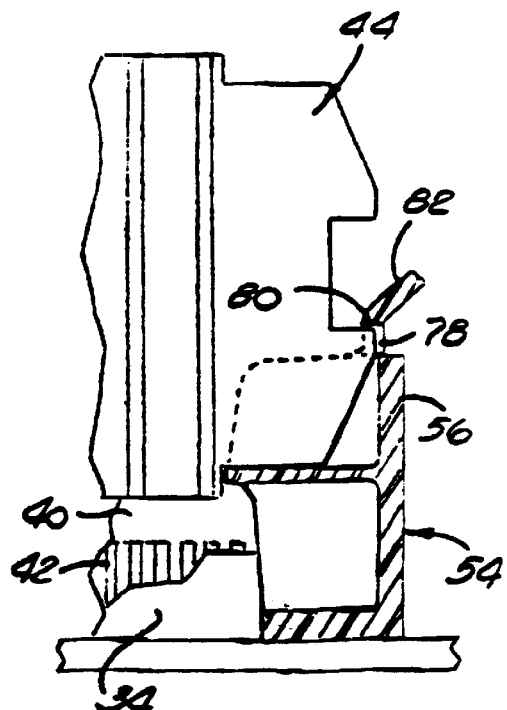
FIG. 5 is a side sectional view of a substrate and a heat sink inserted into a retention mechanism.

As shown in FIG. 5, one of the latch apertures 78 may receive a tab 80 of the heat sink 44. When inserted into the aperture 78, the tab 80 prevents the electronic assembly 32 from being pulled out of the connector 34. The retention mechanism 54 may have an inward angle of approximately 3.2° to apply a compressive force on the heat sink 44. The compressive force prevents the substrate 40 from moving relative to the connector 34. The compressive force has been found to be adequate to allow the retention mechanism to withstand 50 G's in all axes. To remove the assembly 32 an operator can depress a latch arm 82 to move the backwall 56 so that the tab 80 is separated from the retention mechanism 54. For an assembly 30 with two retention mechanisms 54 the operator can decouple tabs 80 that are located on both sides of the heat sink 44 from the latch apertures 78. Once the tabs 80 are decoupled from the retention mechanisms 54 the operator can pull the substrate 40 out of the connector 34.

The widths of each slot 60 are preferably such that the walls 58 apply a spring force onto the sides of the heat sink 44. The slots 60 may be symmetrically located on the retention mechanism so that a mechanism can be installed on either the right side or left side of the connector 34. This design eliminates the need for a right hand part and a separate left hand part. Separate right hand and left hand parts would increase the complexity of the assembly process and the inventory required for the assembly 30. The walls and studs of the retention mechanisms may all be integrated into a single injection molded part. Additionally, the insertion of the heat sink 44 into the retention mechanism creates a "clicking" sound which provides an indication to the person installing the electronic assembly that the substrate 40 is connected to the circuit board.

Figure 6:
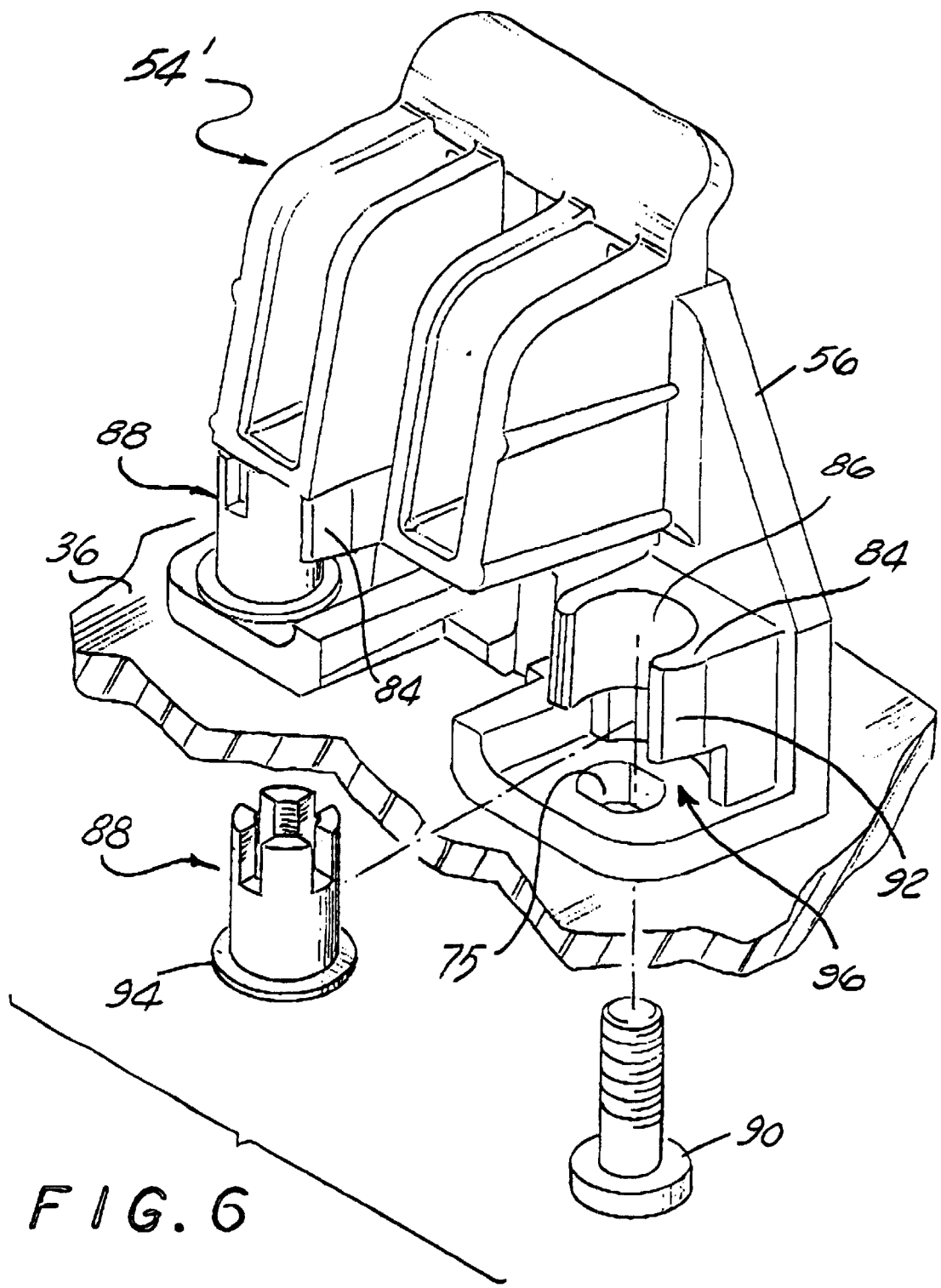
FIG. 6 is a perspective view of an alternate embodiment of the retention mechanism.

FIG. 6 shows another embodiment of a retention mechanism 54' which has a pair of nut retainers 84 which extend from the backwall 56 adjacent to the clearance holes 75. The nut retainers 84 may each have a channel 86 that receives a nut 88. The nuts 88 can be screwed onto threaded studs 90 that extend up from the printed circuit board 36. The nuts 88 and studs 90 secure the retention mechanism 54' to the circuit board 36.

Each nut retainer 84 may have a pair of arms 92 which extend about the channel 86 in a circular pattern. The arms 92 are flexible enough so that the nuts 88 can be snapped into the channels 86. The distance between the ends of the arms 92 is less than the diameter of the nuts 88 so that the nuts 88 are captured by the nut retainers 84. The nuts 88 may each have a flange 94 that extends into a groove 96 of a nut retainer 84. The flange 94 may have a thickness that is less than a height of the groove 96 to provide space for the nut to move up when initially placed on the stud 90. This allows the nut 88 to be tightened onto the stud 90 without cross threading.

The nut retainers 84 allow a manufacturer of the retainer mechanism 54' to ship the mechanism 54' with the nuts 88. An assembler can install the retainer mechanism 54' by placing the mechanism 54 onto the printed circuit board 36 so that the studs 90 extend through the holes 75. The nuts 88 can be rotated onto the studs 90 to attach the retainer mechanism 54' to the circuit board 36.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electrical assembly, comprising:
    a printed circuit board;
    a retention mechanism mounted to said printed circuit board using a nut, said retention mechanism including a plurality of walls that create a heat sink slot to receive a heat sink, a substrate slot to receive a substrate, and a nut retainer to retain the nut to secure the retention mechanism to said printed circuit board; and,
    an electronic assembly that is coupled to said printed circuit board, said electronic assembly includes said substrate that is inserted into said substrate slot and said heat sink that is inserted into said heat sink slot.

2. The electrical assembly as recited in claim 1, further comprising;
   a connector mounted to said printed circuit board to receive said substrate of said electronic assembly.
3. The electrical assembly as recited in claim 1, wherein said plurality of walls create a pair of heat sink slots located adjacent to said substrate slot.
4. The electrical assembly as recited in claim 1, further comprising:
   a threaded stud to couple to said nut and mount said retention mechanism to said printed circuit board.
5. The electrical assembly as recited in claim 1, further comprising a backwall that is attached to said plurality of walls.
6. The electrical assembly as recited in claim 5, wherein said backwall has a first latch aperture.
7. The electrical assembly as recited in claim 6, wherein said backwall includes a latch arm.
8. The electrical assembly as recited in claim 1, wherein said printed circuit board is a motherboard and said electronic assembly is a daughtercard.
9. The electrical assembly as recited in claim 8, wherein said motherboard is a personal computer motherboard and said daughtercard includes a microprocessor.
10. The electrical assembly as recited in claim 1, wherein said nut retainer has a pair of arms extending about a channel that receives the nut.
11. The electrical assembly as recited in claim 10, wherein said pair of arms are flexible so that the nut can be snapped into said channel.
12. The electrical assembly as recited in claim 10, wherein said pair of arms extends about said channel in a circular pattern.
13. The electrical assembly as recited in claim 10, wherein a distance between ends of said pair of arms extending about said channel is less than a diameter of the nut so that the nut is captured by said nut retainer.
14. The electrical assembly as recited in claim 1, wherein said nut retainer has a groove to receive a flange of the nut to allow the nut to be rotated onto a threaded stud.
15. The electrical assembly as recited in claim 14, wherein a thickness of the flange of the nut is less than a height of the groove to provide space for the nut to move up and allow the nut to be rotated onto the threaded stud without cross threading.
16. A method for installing an electronic assembly which includes a substrate and a heat sink, the method comprising:
   mounting a retention mechanism to a printed circuit board using a nut captured In a nut retainer in the retention mechanism and a threaded stud coupled to said nut;
   inserting the substrate into a substrate slot of said retention mechanism that is mounted to said printed circuit board; and
   inserting the heat sink into a heat sink slot of said retention mechanism.
17. The method as recited in claim 16, wherein a tab of the heat sink is inserted into a latch aperture of said retention mechanism.
18. The method as recited in claim 16, wherein
   said mounting of said retention mechanism to said printed circuit board includes,
      inserting said threaded stud through an opening in said printed circuit board and an opening in said retention mechanism, and
      rotating said nut onto said threaded shaft to secure said retention mechanism to said printed circuit board.
19. The method as recited in claim 18, wherein
   said mounting of said retention mechanism to said printed circuit board includes,
      snapping said nut into said nut retainer of said retention mechanism.
20. An electrical assembly comprising:
   a printed circuit board;
   a threaded stud that extends from said printed circuit board;
   a retention mechanism mounted to said printed circuit board, said retention mechanism including a plurality of walls that create a heat sink slot to receive a heat sink, said retention mechanism further having a nut retainer;
   a nut that is captured by said nut retainer and is rotated onto said threaded stud;
   a substrate to extend through a substrate slot of said retention mechanism
   and wherein said heat sink to extend into said heat sink slot.
21. The electrical assembly as recited in claim 20, wherein said nut retainer has a pair off arms extending about a channel that receives the nut.
22. The electrical assembly as recited in claim 21, wherein said pair of arms are flexible so that the nut can be snapped into said channel.
23. The electrical assembly as recited in claim 21, wherein said pair off arms extends about said channel in a circular pattern.
24. The electrical assembly as recited in claim 21, wherein a distance between ends of said pair off arms extending about said channel is less than a diameter of the nut so that the nut is captured by said nut retainer.
25. The electrical assembly as recited in claim 20, wherein said nut retainer has a groove to receive a flange of the nut to allow the nut to be rotated onto a threaded stud.
26. The electrical assembly as recited in claim 25, wherein a thickness of the flange of the nut is less than a height of the groove to provide space for the nut to move up and allow the nut to be rotated onto the threaded stud without cross threading.
27. An assembly comprising:
   a printed circuit board;
   a first retention mechanism mounted to the printed circuit board, the first retention mechanism including
      a first heat sink slot to receive a first end of a heat sink,
      a first substrate slot to receive a first end of a substrate, and
      a first pair of clearance holes to receive a first pair of studs;
   a second retention mechanism mounted to the printed circuit board, the second retention mechanism including
      a second heat sink slot to receive a second end of the heat sink,
      a second substrate slot to receive a second end of the substrate,
      a second pair of clearance holes to receive a second pair of studs;
   the substrate to extend into the first and second substrate slots; and
   the heat sink to extend into the first and second heat sink slots.
28. The assembly as recited in claim 27, further comprising:

an electrical connector aligned with the first substrate slot and the second substrate slot between the first and second retention mechanisms, the electrical connector to couple to contacts of the substrate extended through the first and second substrate slots.

29. The assembly as recited in claim 27, wherein the first retention mechanism further includes a third heat sink slot to alternatively receive the first end of the heat sink, and the second retention mechanism further includes a fourth heat sink slot to alternatively receive the second end of the heat sink.

30. An assembly comprising:

a printed circuit board;

a first retention mechanism mounted to the printed circuit board, the first retention mechanism including
  a first heat sink slot to receive a first end of a heat sink,
  a first substrate slot to receive a first end of a substrate,
  a first pair of clearance holes to receive a first pair of studs, and
  a third heat sink slot to alternatively receive the first end of the heat sink;

a second retention mechanism mounted to the printed circuit board, the second retention mechanism including
  a second heat sink slot to receive a second end of the heat sink,
  a second substrate slot to receive a second end of the substrate,
  a second pair of clearance holes to receive a second pair of studs, and
  a fourth heat sink slot to alternatively receive the second end of the heat sink;

the substrate to extend into the first and second substrate slots, and the heat sink to extend into the first and second heat sink slots or the third and fourth heat sink slots.

31. The assembly as recited in claim 30, further comprising:

an electrical connector aligned with the first substrate slot and the second substrate slot between the first and second retention mechanisms, the electrical connector to couple to contacts of the substrate extended through the first and second substrate slots.

32. The assembly as recited in claim 30, wherein the first retention mechanism further includes a third heat sink slot to alternatively receive the first end of the heat sink, and the second retention mechanism further includes a fourth heat sink slot to alternatively receive the second end of the heat sink.

* * * * *